US009859407B2

(12) United States Patent
Tang et al.

(10) Patent No.: US 9,859,407 B2
(45) Date of Patent: *Jan. 2, 2018

(54) IGBT HAVING DEEP GATE TRENCH

(71) Applicant: Infineon Technologies Americas Corp., El Segundo, CA (US)

(72) Inventors: Yi Tang, Torrance, CA (US); Niraj Ranjan, El Segundo, CA (US); Chiu Ng, El Segundo, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 11 days.

This patent is subject to a terminal disclaimer.

(21) Appl. No.: 15/078,168

(22) Filed: Mar. 23, 2016

(65) Prior Publication Data

US 2016/0204238 A1    Jul. 14, 2016

Related U.S. Application Data

(63) Continuation of application No. 13/791,720, filed on Mar. 8, 2013, now Pat. No. 9,299,819.

(60) Provisional application No. 61/616,986, filed on Mar. 28, 2012.

(51) Int. Cl.
| | |
|---|---|
| *H01L 29/10* | (2006.01) |
| *H01L 29/739* | (2006.01) |
| *H01L 29/06* | (2006.01) |
| *H01L 29/08* | (2006.01) |

(Continued)

(52) U.S. Cl.
CPC ...... *H01L 29/7397* (2013.01); *H01L 29/0696* (2013.01); *H01L 29/0821* (2013.01); *H01L 29/1004* (2013.01); *H01L 29/1095* (2013.01); *H01L 29/41708* (2013.01); *H01L 29/45* (2013.01)

(58) Field of Classification Search
CPC ............ H01L 29/7397; H01L 29/0696; H01L 29/7813
See application file for complete search history.

(56) References Cited

U.S. PATENT DOCUMENTS

| | | | | |
|---|---|---|---|---|
| 5,471,075 | A * | 11/1995 | Shekar | H01L 29/0839 257/139 |
| 6,649,975 | B2 * | 11/2003 | Baliga | H01L 23/552 257/327 |
| 6,747,295 | B2 | 6/2004 | Inoue | |

(Continued)

*Primary Examiner* — Jaehwan Oh
(74) *Attorney, Agent, or Firm* — Murphy, Bilak & Homiller, PLLC

(57) ABSTRACT

There are disclosed herein various implementations of an insulated-gate bipolar transistor (IGBT) with buried depletion electrode. Such an IGBT may include a collector at a bottom surface of a semiconductor substrate, a drift region having a first conductivity type situated over the collector, and a base layer having a second conductivity type opposite the first conductivity type situated over the drift region. The IGBT also includes a plurality of deep insulated trenches with a buried depletion electrode and at least one gate electrode disposed therein. In addition, the IGBT includes an active cell including an emitter adjacent the gate electrode, and an implant zone, situated between adjacent deep insulated trenches. The implant zone is formed below the base layer and has the first conductivity type. In one implementation, the IGBT may also include a dummy cell neighboring the active cell.

20 Claims, 7 Drawing Sheets

(51) Int. Cl.
    *H01L 29/417*    (2006.01)
    *H01L 29/45*     (2006.01)

(56) References Cited

U.S. PATENT DOCUMENTS

| | | | | |
|---|---|---|---|---|
| 7,465,986 | B2* | 12/2008 | Girdhar | H01L 29/407 |
| | | | | 257/330 |
| 7,615,846 | B2* | 11/2009 | Harada | H01L 29/0696 |
| | | | | 257/578 |
| 8,058,670 | B2* | 11/2011 | Hshieh | H01L 29/0619 |
| | | | | 257/136 |
| 8,232,610 | B2* | 7/2012 | Nakazawa | H01L 27/0255 |
| | | | | 257/287 |
| 9,245,985 | B2 | 1/2016 | Tang | |
| 2006/0060916 | A1* | 3/2006 | Girdhar | H01L 29/407 |
| | | | | 257/330 |
| 2009/0283797 | A1 | 11/2009 | Takahashi | |
| 2011/0220962 | A1* | 9/2011 | Koyama | H01L 29/0696 |
| | | | | 257/139 |
| 2011/0233684 | A1* | 9/2011 | Matsushita | H01L 29/1095 |
| | | | | 257/378 |
| 2012/0217541 | A1* | 8/2012 | Hsieh | H01L 29/7397 |
| | | | | 257/140 |
| 2013/0256745 | A1 | 10/2013 | Tang | |

* cited by examiner

IGBT HAVING DEEP GATE TRENCH

RELATED APPLICATIONS

This is a continuation of application Ser. No. 13/791,720 filed on Mar. 8, 2013, which claims benefit of and priority to U.S. Provisional Patent Application Ser. No. 61/616,986 filed on Mar. 28, 2012. The disclosures in the above-identified patent applications are hereby incorporated fully by reference into the present application.

BACKGROUND

Insulated-gate bipolar transistors (IGBTs) may be implemented in a variety of power applications. For example, IGBTs may be used as power switches in motor drive inverters. In such power applications, the collector-to-emitter saturation voltage ($V_{CE(on)}$) and short-circuit withstand time ($T_{SC}$) are typically key operating parameters. In motor drive inverters, for example, a long $T_{SC}$ is typically desirable in order to enable detection of a motor fault condition and to allow time for system shutdown without damage to the system.

$T_{SC}$ is known to depend inversely on IGBT saturation current, which in turn depends on the channel density of the IGBT. Thus, a reduction in channel density and saturation current can result in a corresponding advantageous increase in $T_{SC}$. However, reductions in channel density and saturation current typically have the undesirable effect of increasing $V_{CE(on)}$, thereby reducing IGBT efficiency.

SUMMARY

The present disclosure is directed to a deep gate trench insulated-gate bipolar transistor (IGBT), substantially as shown in and/or described in connection with at least one of the figures, and as set forth more completely in the claims.

DETAILED DESCRIPTION

Figure 1A:
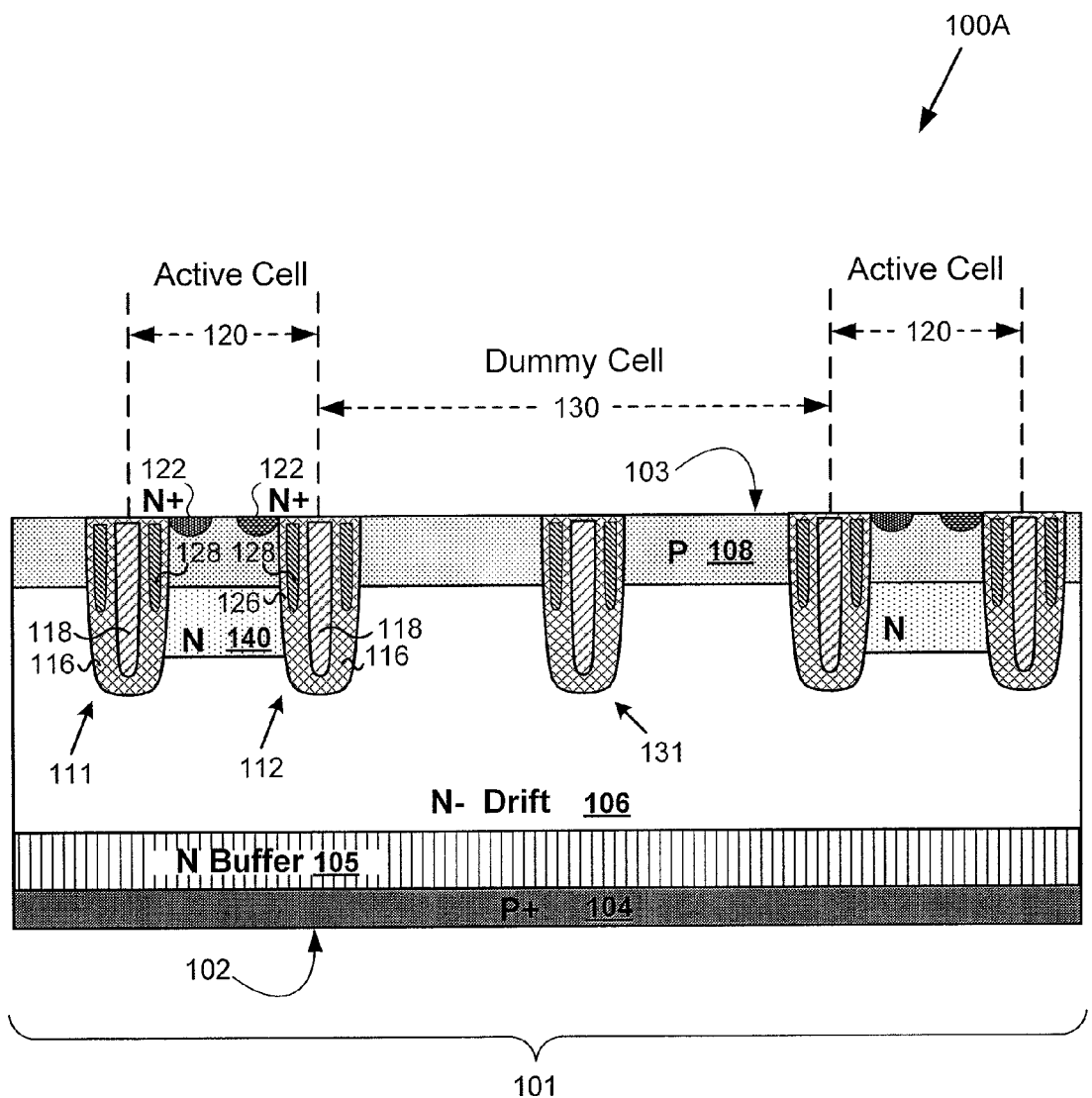
FIG. 1A presents a cross-sectional view of an exemplary deep trench insulated-gate bipolar transistor (IGBT) structure, according to one implementation.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As previously discussed, insulated-gate bipolar transistors (IGBTs) can be implemented in a variety of power applications for which collector-to-emitter saturation voltage ($V_{CE(on)}$) and short-circuit withstand time ($T_{SC}$) are important parameters. As further noted above, $T_{SC}$ is known to depend inversely on IGBT saturation current, which depends in turn on the channel density of the IGBT. As a result, a reduction in channel density and saturation current can result in a corresponding advantageous increase in $T_{SC}$, rendering the IGBT more durable. However, reductions in channel density and saturation current typically have the undesirable effect of increasing $V_{CE(on)}$, thereby reducing IGBT efficiency.

The present application discloses implementations of a deep gate trench IGBT that advantageously enable concurrent improvements in $V_{CE(on)}$ and $T_{SC}$. For example, FIG. 1A presents a cross-sectional view of a deep trench IGBT structure wherein each deep trench includes gate electrodes and a depletion electrode.

FIG. 1A shows a portion of IGBT 100A in semiconductor substrate 101. IGBT 100A includes P type collector 104 at bottom surface 102 of semiconductor substrate 101, and N type drift region 106 situated over P type collector 104. In addition, P type base layer 108 is situated over N type drift region 106. IGBT 100A also includes active cells 120 and dummy cell 130 neighboring active cells 120. It is noted that although FIG. 1A, as well as the exemplary implementations shown by FIGS. 3 and 5 and described below, explicitly depict two active cells neighbored by a single dummy cell, those representations are merely provided for conceptual clarity. One of ordinary skill in the art will appreciate that an IGBT based on the present inventive principles may include many additional active cells corresponding to active cells 120, as well as additional dummy cells corresponding to dummy cell 130, neighboring those additional active cells.

Semiconductor substrate 101 may be a silicon substrate, for example, and may include N type drift region 106 and P type base layer 108 formed in an epitaxial silicon layer of semiconductor substrate 101. Formation of such an epitaxial silicon layer may be performed by any suitable method, as known in the art, such as chemical vapor deposition (CVD) or molecular beam epitaxy (MBE), for example. More generally, however, N type drift region 106 and P type base layer 108 may be formed in any suitable group IV layer included in semiconductor substrate 101. Thus, in other implementations, N type drift region 106 and P type base layer 108 need not be formed through epitaxial growth, and/or need not be formed of silicon. For example, in one alternative implementation, N type drift region 106 and P type base layer 108 can be formed in a float zone silicon layer of semiconductor substrate 101. In other implementations, N type drift region 106 and P type base layer 108 can be formed in either a strained or unstrained germanium layer formed as part of semiconductor substrate 101. Furthermore, P type base layer 108 may also be formed by implantation and thermal diffusion. Moreover, in some implementations, semiconductor substrate 101 may include additional layers, such as N type buffer or field stop layer 105 situated between P type collector 104 and N type drift region 106, and/or an optional conductive material formed over dummy cell 130 (conductive material over dummy cell 130 not shown in FIG. 1A).

Each of active cells 120 includes N type emitter diffusions 122, and N type implant zone 140 situated between first and second deep insulated trenches 111 and 112, respectively. First and second deep insulated trenches 111 and 112 provide a gate for active cell 120, and each also has a buried depletion electrode disposed therein. Regarding the specific example shown by FIG. 1A, active cells 120 are implemented using a split gate configuration. According to that exemplary implementation, each of first and second deep insulated trenches 111 and 112 includes an upper portion providing a gate including gate insulator 126 and gate electrode 128, as well as a lower portion including thick insulation 116 and buried depletion electrode 118. Also shown in FIG. 1A is dummy cell deep insulated trench 131 in dummy cell 130.

N type emitter diffusions 122 may be formed in P type base layer 108 using any conventional techniques known in the art. For example, phosphorus (P) or arsenic (AS) dopants may be implanted into P type base layer 108 and diffused to form N type emitter diffusions 122. Although not explicitly shown in the cross-sectional perspective provided by FIG. 1A, N type emitter diffusions 122 can be electrically connected to corresponding N type emitter diffusions in other active cells 120 of IGBT 100A in the third dimension relative to the cross-sectional plane of FIG. 1A.

N type implant zone 140 may be formed by implantation of N type dopants, such as P or AS, for example, into N type drift region 106 between first and second deep insulated trenches 111 and 112. In one implementation, for example, N type implant zone 140 may have a doping concentration of from approximately $10^{17}/cm^3$ to approximately $10^{18}/cm^3$. It is noted, however, that N type implant zone 140 does not extend to dummy cell 130. Thus, according to the present implementation, N type implant zone 140 is present only within active cells 120.

As shown in FIG. 1A, first and second deep insulated trenches 111 and 112, and dummy cell deep insulated trench 131, extend from semiconductor surface 103 above P type base layer 108 into N type drift region 106. First and second deep insulated trenches 111 and 112, and dummy cell deep insulated trench 131, may extend to a depth of greater than approximately six micrometers (6 µm) below semiconductor surface 103, for example, such as to a depth of approximately 12 µm, or deeper. As further shown in FIG. 1A, first and second deep insulated trenches 111 and 112, and dummy cell deep insulated trench 131 may each include buried depletion electrode 118, thick insulation 116, gate electrode 128, and gate insulator 126.

Gate insulator 126 may be formed using any material and any technique typically employed in the art. For example, gate insulator 126 may be a gate oxide, such as silicon oxide, and may be deposited or thermally grown to produce gate insulator 126. Gate electrode 128 may also be formed using any material typically utilized in the art. For example, gate electrode 128 may be formed of doped polysilicon. As described above by reference to N type emitter diffusions 122, although the electrical connection among gate electrodes 128 of IGBT 100A is not explicitly shown in the cross-sectional perspective provided by FIG. 1A, gate electrodes 128 can be shorted together in the third dimension relative to the cross-sectional plane of FIG. 1A.

First and second deep insulated trenches 111 and 112, and dummy cell deep insulated trench 131, include thick insulation 116. Thick insulation 116 may be formed of the same material and using the same technique utilized for formation of gate insulator 126. That is to say, thick insulation 116 may be formed as a thermally grown oxide, such as silicon oxide.

However, it is noted that even when formed of substantially the same dielectric material and formed using substantially the same fabrication technique, thick insulation 116 is distinguishable from gate insulator 126 by being formed as a thicker trench insulation than the trench insulation provided by gate insulator 126.

First and second deep insulated trenches 111 and 112, and dummy cell deep insulated trench 131, also include buried depletion electrode 118. Buried depletion electrode 118 may be formed of the same material and using the same technique utilized for formation of gate electrode 128. That is to say, buried depletion electrode 118 may be formed of doped polysilicon. More generally, however, buried depletion electrode 118 may be formed of any suitable conductor, such as doped polysilicon, or metal, for example. According to the implementation shown in FIG. 1A, each of buried depletion electrodes 118 is electrically shorted to N type emitter diffusions 122 of IGBT 100A in the third dimension relative to the cross-sectional plane of FIG. 1A (electrical connection not explicitly shown in the cross-sectional perspective of FIG. 1A).

IGBT 100A provides both improved (i.e., longer) $T_{SC}$ and improved (i.e., reduced) $V_{CE(on)}$, concurrently. By situating dummy cell 130 so as to neighbor active cells 120, IGBT 100A has a reduced channel density relative to typical IGBT designs from which dummy cell 130 is omitted. Consequently, the saturation current of IGBT 100A is reduced, resulting in an advantageously increased $T_{SC}$. In addition, the presence of implant zone 140 in each of active cells 120 improves conductivity modulation in IGBT 100A by enhancing the carrier profile in N type drift region 106 in the conducting state, thereby advantageously reducing $V_{CE(on)}$. Moreover, buried depletion electrodes 118 can be used to deplete implant zone 140 in the blocking state, when buried depletion electrodes 118 are tied to a low electrical potential, e.g., grounded or at a near ground potential, to support a high breakdown voltage for IGBT 100A.

With respect to the specific implementation shown in FIG. 1A, it is noted that many modifications are possible. For example, although dummy cell 130 is shown to include a single dummy cell deep insulated trench 131, that representation is merely exemplary. In other implementations, dummy cell 130 may include more, many more, or fewer than one dummy cell deep insulated trench 131. That is to say, dummy cell 130 may include as few as zero, or as many as "n" dummy cell deep insulated trenches 131, where "n" is any desired integer value. Moreover, dummy cell deep insulated trench 131 may or may not include gate electrodes 128. Including gate electrodes 128 in dummy cell deep insulated trench 131 may be desirable from a fabrication process flow standpoint, but in some implementations, dummy cell deep insulated trench 131 may omit gate electrodes 128 and be substantially filled by thick insulation 116 and buried depletion electrode 118.

Figure 1B:
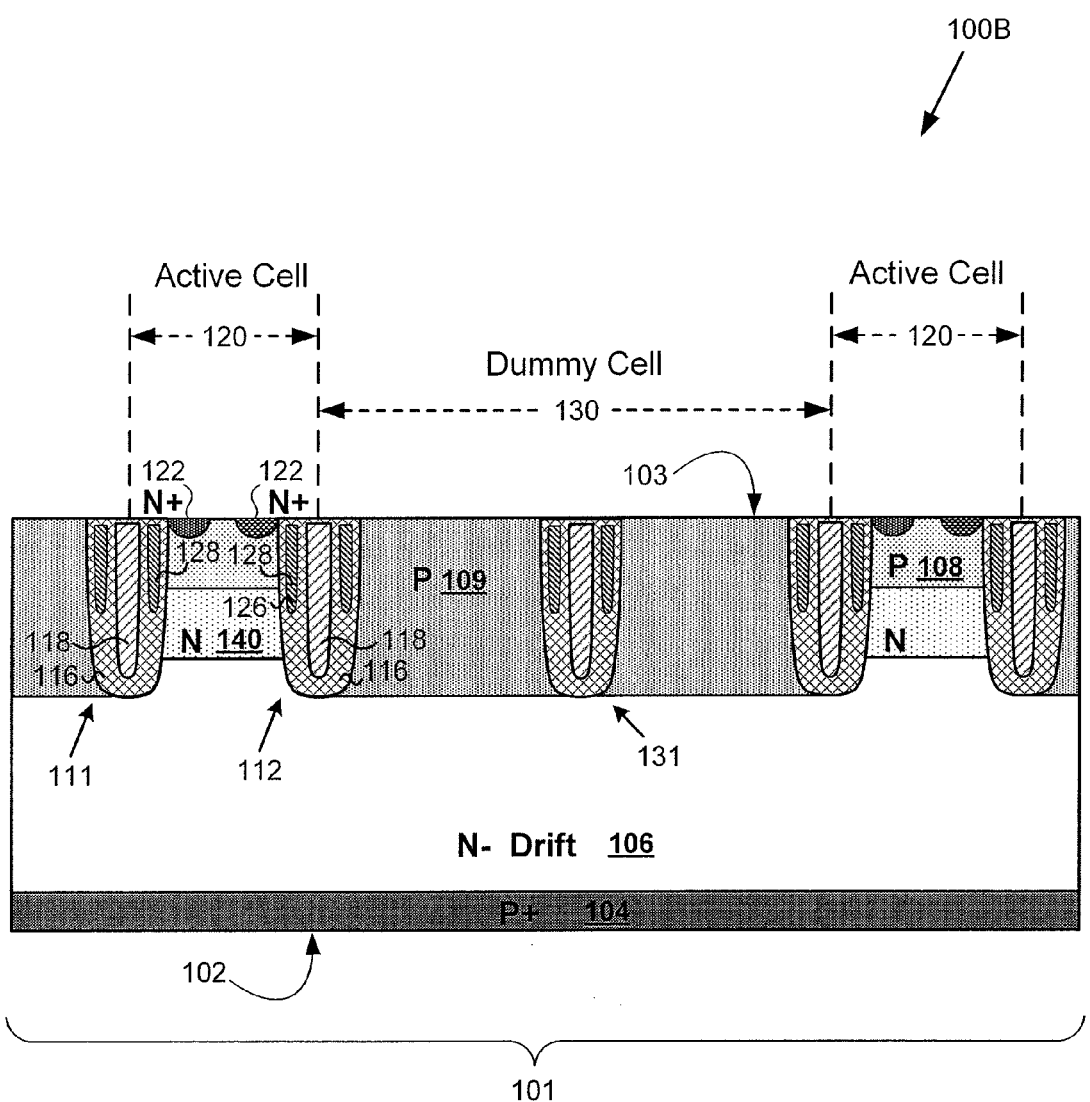
FIG. 1B presents a cross-sectional view of an exemplary deep trench IGBT structure, according to another implementation.

Referring to FIG. 1B, FIG. 1B presents a cross-sectional view of exemplary deep trench IGBT structure 100B, according to another implementation. It is noted that features identified by reference numbers previously shown and described in relation to FIG. 1A, above, correspond respectively to those previously discussed features and may share any of the characteristics attributed to those features above. In contrast to the implementation shown by FIG. 1A, in which P type base layer 108 extends to dummy cell 130, according to the implementation in FIG. 1B, dummy cell 130 may include deep P type diffusion region 109 having a depth deeper than P type base layer 108, such as a depth similar to that of dummy cell deep insulated trench 131.

Deep P type diffusion region 109 may extend across substantially the entire width of dummy cell 130, or may terminate within dummy cell 130 so as to leave a gap between deep P type diffusion region 109 and its respective nearest neighbor deep insulated trenches of active cells 120, i.e. deep insulated trench 111 and 112.

Figure 1C:
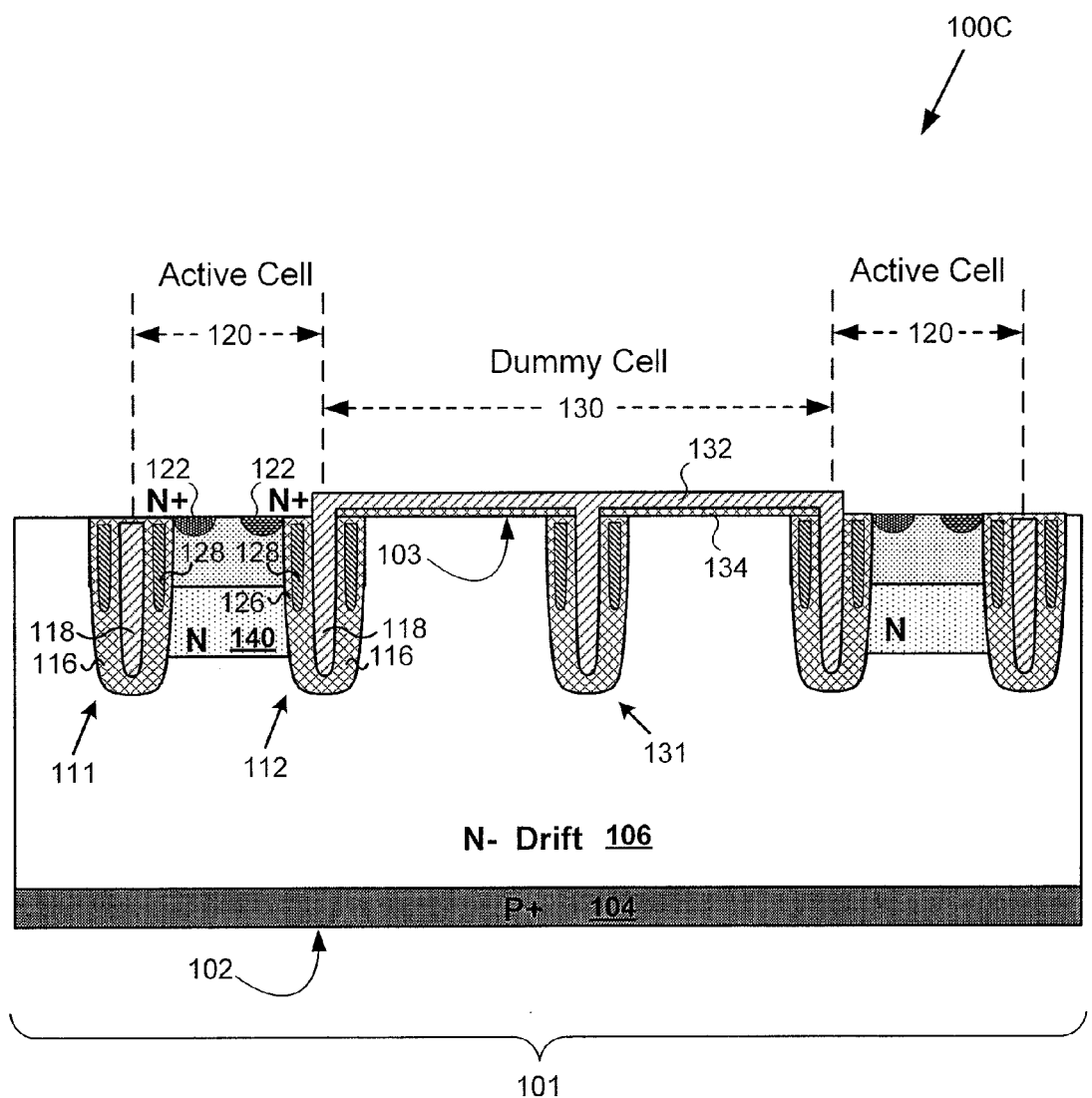
FIG. 1C presents a cross-sectional view of an exemplary deep trench IGBT structure, according to another implementation.

Moving to FIG. 1C, FIG. 1C presents a cross-sectional view of exemplary deep trench IGBT structure 100C, according to another implementation. It is noted that features identified by reference numbers previously shown and described in relation to FIGS. 1A and/or 1B, above, correspond respectively to those previously discussed features and may share any of the characteristics attributed to those features above.

Like the implementation shown in FIG. 1B, P type base layer 108 does not extend into dummy cell 130 in IGBT structure 100C of FIG. 1C. However, unlike IGBT structure 100B, IGBT structure 100C also omits deep P type diffusion region 109 from dummy cell 130. According to the implementation shown in FIG. 1C, N type drift region 106 extends upward in dummy cell 130 to semiconductor surface 103. In addition, optional conductive material 132 may be formed over semiconductor surface 103 in dummy cell 130, and may be insulated from semiconductor surface 103 by insulator layer 134. Insulator layer 134 may be formed of silicon oxide or silicon nitride, while conductive material 132 may be formed of polysilicon. It is noted that, as shown in FIG. 1C, optional conductive material 132 may be shorted to buried depletion electrode 118 in deep insulated trenches 111 and 112 and dummy cell deep insulated trench 131.

Figure 2:
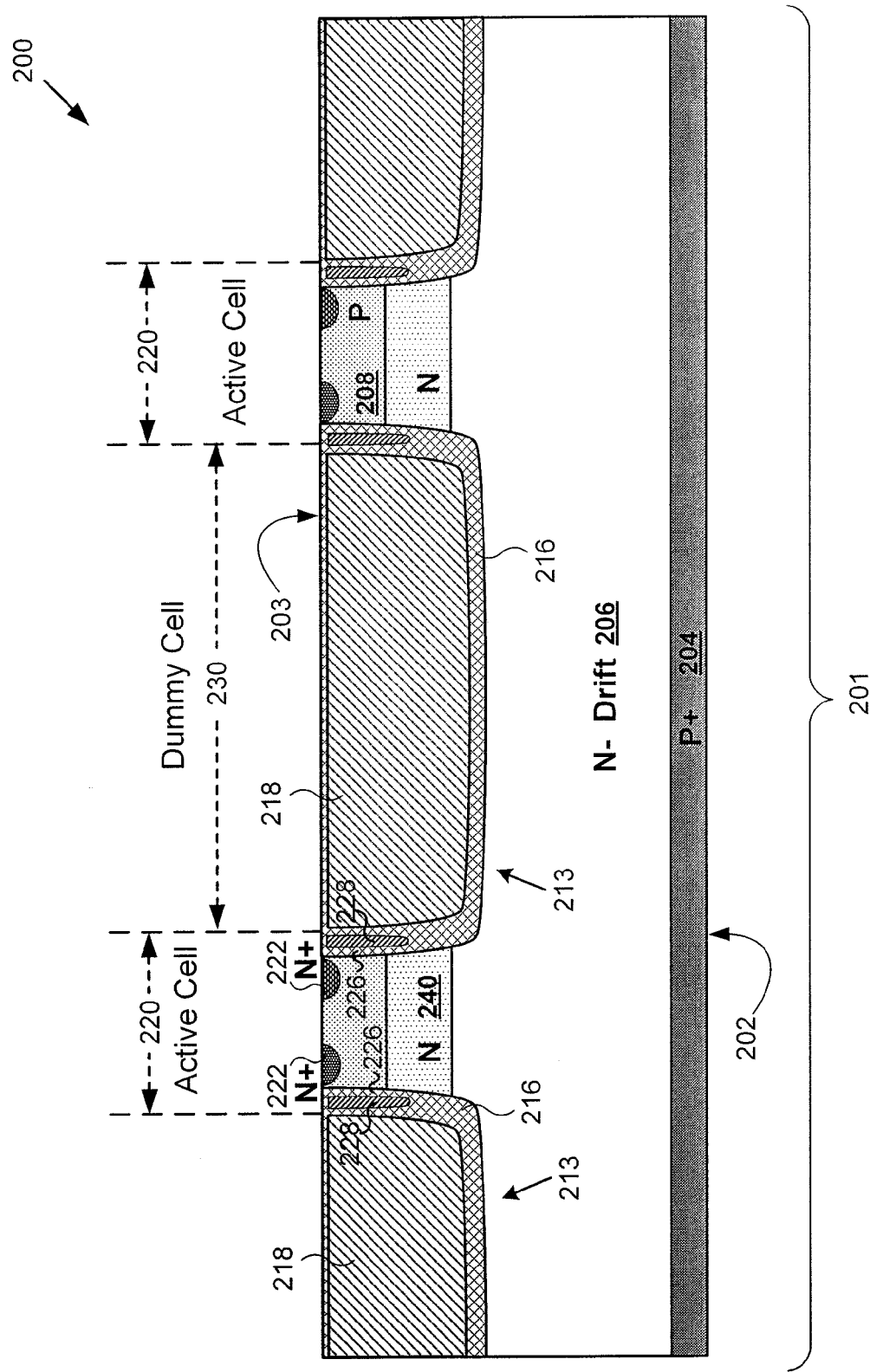
FIG. 2 presents a cross-sectional view of another exemplary deep trench IGBT structure.

Referring now to FIG. 2, FIG. 2 presents a cross-sectional view of another exemplary deep trench IGBT structure including buried depletion electrodes. IGBT 200 includes P type collector 204 at bottom surface 202 of semiconductor substrate 201, and N type drift region 206 situated over P type collector 204. In addition, P type base layer 208 is situated over N type drift region 206. IGBT 200 also includes active cells 220, each of which includes N type emitter diffusions 222, as well as gate insulator 226 and gate electrodes 228 situated in wide deep insulated trenches 213. Each of active cells 220 also includes N type implant zone 240 situated between wide deep insulated trenches 213.

Active cells 220 are situated adjacent dummy cells 230, the substantial entirety of which, according to the implementation of FIG. 2, are formed by wide deep insulated trenches 213. Also shown in FIG. 2 are thick insulation 216 and wide buried depletion electrodes 218 disposed in each of wide deep insulated trenches 213.

Semiconductor substrate 201 corresponds to semiconductor substrate 101, in FIGS. 1A, 1B, and 1C. That is to say, P type collector 204, N type drift region 206, P type base layer 208, and N type implant zones 240, in FIG. 2, correspond respectively to P type collector 104, N type drift region 106, P type base layer 108, and N type implant zones 140, in FIGS. 1A, 1B, and 1C, and, thus, may share any of the characteristics previously attributed to those corresponding features, above. In addition, N type emitter diffusions 222, gate insulator 226, thick insulation 216, and gate electrodes 228, in FIG. 2, correspond respectively to N type emitter diffusions 122, gate insulator 126, thick insulation 116, and gate electrodes 128, in FIGS. 1A, 1B, and 1C.

IGBT 200, in FIG. 2, differs from IGBT 100A, IGBT 100B, and IGBT 100C in respective FIGS. 1A, 1B, and 1C, in that substantially the entirety of dummy cell 230 is formed as wide deep insulated trenches 213 including wide buried depletion electrode 218. Like first and second deep insulated trenches 111 and 112, in FIGS. 1A, 1B, and 1C, wide deep insulated trenches 213, in FIG. 2, extend from surface 203 into N type drift region 206. Moreover, the depth of wide deep insulated trenches 213 may be substantially the same as the depth of first and second deep insulated trenches 111 and 112.

Like buried depletion electrodes 118, wide buried depletion electrodes 218 may be formed of the same material and using the same technique utilized for formation of gate electrodes 228. That is to say, wide buried depletion electrodes 218 may be formed of doped polysilicon. More generally, wide buried depletion electrodes 218 may be formed of any suitable conductor, such as doped polysilicon, or metal, for example. According to the implementation of FIG. 2, wide buried depletion electrodes 218 are shorted to N type emitter diffusions 222 of IGBT 200 in the third dimension relative to the cross-sectional plane of FIG. 2 (electrical connections not explicitly shown in the cross-sectional perspective of FIG. 2).

Like IGBT 100A, IGBT 100B, and IGBT 100C, in respective FIGS. 1A, 1B, and 1C, IGBT 200 is capable of providing both improved (i.e., longer) $T_{SC}$ and improved (i.e., reduced) $V_{CE(on)}$, concurrently. By implementing trenches 213 as a wide deep insulated trenches, IGBT 200 has a reduced channel density relative to conventional IGBT designs. Consequently, the saturation current of IGBT 200 is reduced, resulting in an advantageous increase in $T_{SC}$. In addition, the presence of implant zone 240 in each of active cells 220 improves conductivity modulation in IGBT 200 by enhancing the carrier profile in N type drift region 206 in the conducting state, thereby advantageously reducing $V_{CE(on)}$. Moreover, buried depletion electrodes 218 can be used to deplete implant zone 240 in the blocking state, when buried depletion electrodes 218 are tied to a low electrical potential, e.g., grounded or at a near ground potential, to support a high breakdown voltage for IGBT 200.

Figure 3:
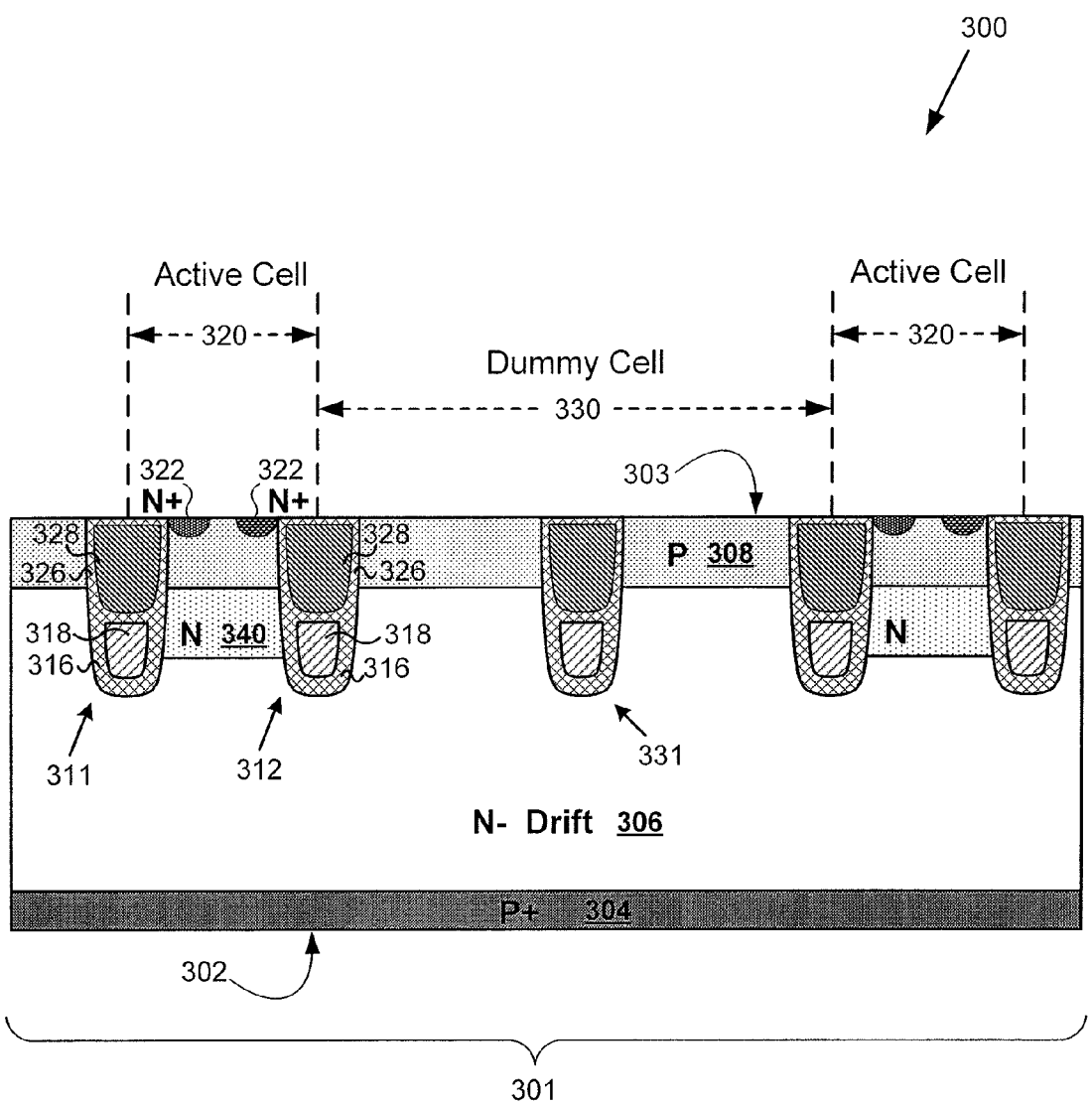
FIG. 3 presents a cross-sectional view of another exemplary deep trench IGBT structure.

Continuing to FIG. 3, FIG. 3 presents a cross-sectional view of another exemplary deep trench IGBT structure including buried depletion electrodes. IGBT 300 includes P type collector 304 at bottom surface 302 of semiconductor substrate 301, and N type drift region 306 situated over P type collector 304. In addition, P type base layer 308 is situated over N type drift region 306. IGBT 300 also includes active cells 320 and dummy cell 330 neighboring active cells 320. Each of active cells 320 includes N type emitter diffusions 322 and N type implant zone 340 situated between first and second deep insulated trenches 311 and 312. Each of first and second deep insulated trenches 311 and 312 includes gate insulator 326, gate electrode 328, thick insulation 316, and buried depletion electrode 318 disposed therein. Moreover, according to the implementation shown by FIG. 3, dummy cell 330 includes dummy cell deep insulated trench 331 also having gate insulator 326, gate electrode 328, thick insulation 316, and buried depletion electrode 318 disposed therein.

Semiconductor substrate 301 corresponds to semiconductor substrate 101, in FIGS. 1A, 1B, and 1C. That is to say, P type collector 304, N type drift region 306, and N type implant zones 340, in FIG. 3, correspond respectively to P type collector 104, N type drift region 106, and N type implant zones 140, in FIGS. 1A, 1B, and 1C, and, thus, may share any of the characteristics previously attributed to those corresponding features, above. In addition, N type emitter diffusions 322, gate insulator 326, and thick insulation 316 correspond respectively to N type emitter diffusions 122, gate insulator 126, and thick insulation 116, in FIGS. 1A, 1B, and 1C. P type base layer 308 corresponds to P type base layer 108, in FIG. 1A. Furthermore, first and second deep insulated trenches 311 and 312, dummy cell deep insulated trench 331, gate electrode 328, and buried depletion electrode 318, in FIG. 3, correspond in general to first and second deep insulated trenches 111 and 112, dummy cell deep insulated trench 131, gate electrode 128, and buried depletion electrode 118, in FIGS. 1A, 1B, and 1C. For example, the depth of first and second deep insulated trenches 311 and 312, and dummy cell deep insulated trench 331 may be substantially the same as the depth of first and second deep insulated trenches 111 and 112, and dummy cell deep insulated trench 131.

As is true for IGBTs 100A, 100B, and 100C described above, first and second deep insulated trenches 311 and 312 of IGBT 300 provide a gate for active cell 320 and each also has buried depletion electrode 318 disposed therein. According to the exemplary implementation shown in FIG. 3, each of first and second deep insulated trenches 311 and 312 includes an upper portion providing a gate including gate insulator 326 and gate electrode 328, as well as a lower portion including thick insulation 316 and buried depletion electrode 318. It is noted that buried depletion electrode 318 may be disposed under gate electrode 328.

Gate electrode 328 may be formed using any material typically utilized in the art. For example, gate electrode 328 may be formed of doped polysilicon. As described above by reference to FIG. 1A, although the electrical connection among gate electrodes 328 of IGBT 300 is not explicitly shown in the cross-sectional perspective provided by FIG. 3, gate electrodes 328 can be shorted together in the third dimension relative to the cross-sectional plane of FIG. 3.

First and second deep insulated trenches 311 and 312, and dummy cell deep insulated trench 331, each include buried depletion electrode 318. Buried depletion electrode 118 may be formed of the same material and using the same technique utilized for formation of gate electrodes 328. That is to say, buried depletion electrode 318 may be formed of doped polysilicon. More generally, however, buried depletion electrode 318 may be formed of any suitable conductor, such as doped polysilicon, or metal, for example. According to the implementation shown in FIG. 3, each of buried depletion electrodes 318 is electrically shorted to N type emitter diffusions 322 of IGBT 300 in the third dimension relative to the cross-sectional plane of FIG. 3 (electrical connection not explicitly shown in the cross-sectional perspective of FIG. 3).

Like IGBTs 100A, 100B, and 100C, IGBT 300 provides both improved (i.e., longer) $T_{SC}$ and improved (i.e., reduced) $V_{CE(on)}$, concurrently. By situating dummy cell 330 so as to neighbor active cells 320, IGBT 300 has a reduced channel density relative to typical IGBT designs from which dummy cell 330 is omitted. Consequently, the saturation current of IGBT 300 is reduced, resulting in an advantageously increased $T_{SC}$. In addition, the presence of implant zone 340 in each of active cells 320 improves conductivity modulation in IGBT 300 by enhancing the carrier profile in N type drift region 306 in the conducting state, thereby advantageously reducing $V_{CE(on)}$.

Buried depletion electrodes 318 can be used to deplete implant zone 340 in the blocking state, when buried depletion electrodes 318 are tied to a low electrical potential, e.g., grounded or at a near ground potential, to support a high breakdown voltage for IGBT 300. A further advantage accrues from the implementation shown in FIG. 3 due to the position of buried depletion electrode 318 relative to gate electrode 328. Because buried depletion electrode 318 can be disposed under gate electrode 328, buried depletion electrode 318 can also serve to reduce the gate-to-collector capacitance of IGBT 300.

With respect to the specific implementation shown in FIG. 3, it is noted that many modifications are possible. For example, although dummy cell 330 is shown to include a single dummy cell deep insulated trench 331, that representation is merely exemplary. In other implementations, dummy cell 330 may include more, many more, or fewer than one dummy cell deep insulated trench 331. That is to say, dummy cell 330 may include as few as zero, or as many as "n" dummy cell deep insulated trenches 331, where "n" is any desired integer value. Moreover, dummy cell deep insulated trench 331 may or may not include gate electrode 328. Including gate electrode 328 in dummy cell deep insulated trench 331 may be desirable from a fabrication process flow standpoint, but in some implementations, dummy cell deep insulated trench 331 may omit gate electrode 328 and be substantially filled by thick insulation 316 and buried depletion electrode 318.

It is further noted that although substrate 301 is shown to include P type base layer 308 corresponding to P type base layer 108, in FIG. 1A, and to omit a layer corresponding to N type buffer or field stop layer 105, that representation is merely exemplary. In other implementations, substrate 301 may include a layer corresponding to N type buffer layer 105, and/or may implement a deep P type diffusion region corresponding to deep P type diffusion region 109, in FIG. 1B. Alternatively, in some implementations, N type drift region 306 may extend upward in dummy cell 330 to semiconductor surface 303. In addition, a conductive material corresponding to conductive material 132, in FIG. 1C, may be formed over semiconductor surface 303 in dummy cell 330, and may be insulated from semiconductor surface 303 by an insulator layer corresponding to insulator layer 134 in FIG. 1C.

Figure 4:
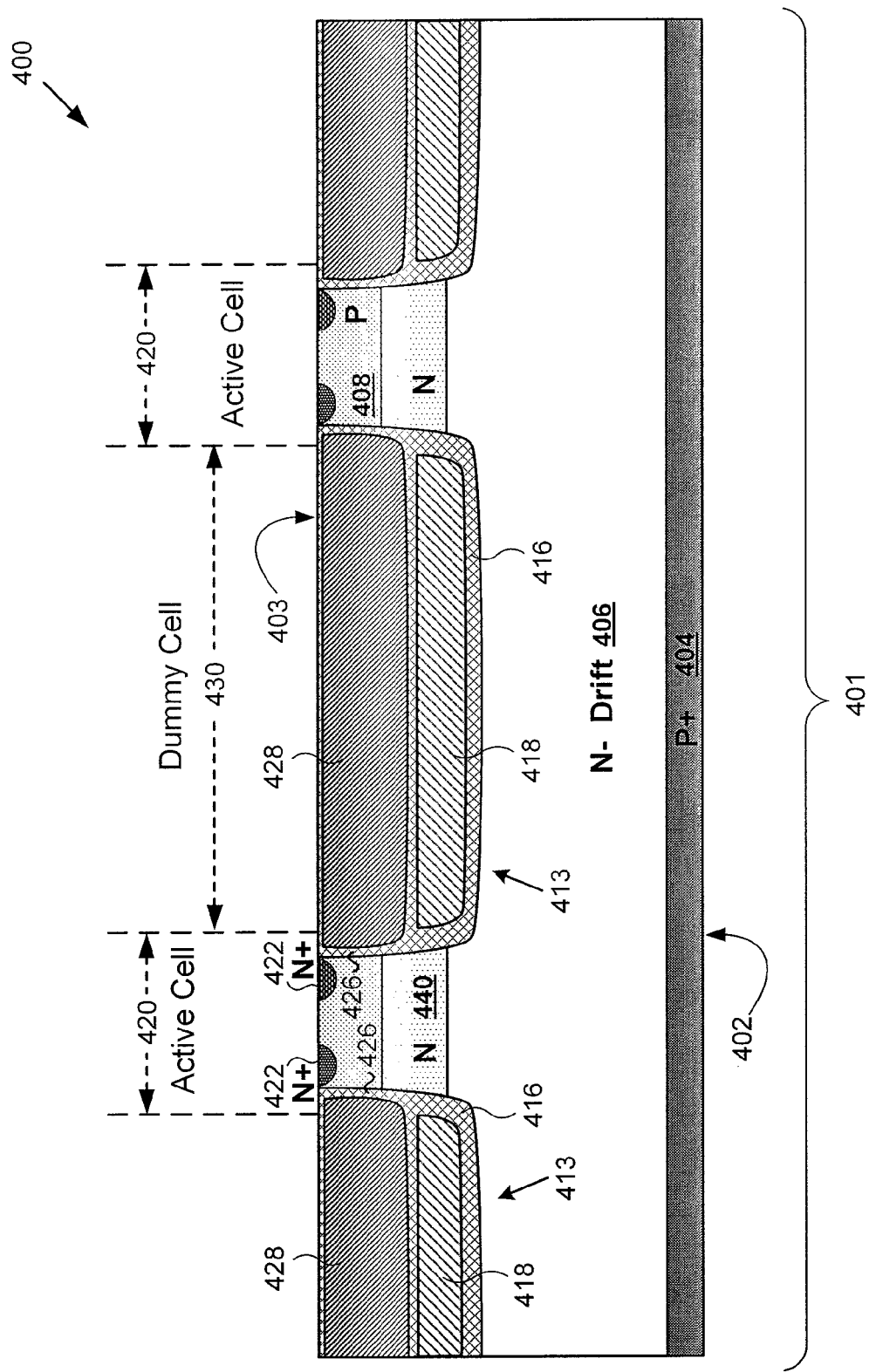
FIG. 4 presents a cross-sectional view of yet another exemplary deep trench IGBT structure.

Referring now to FIG. 4, FIG. 4 presents a cross-sectional view of yet another exemplary deep trench IGBT structure including buried depletion electrodes. IGBT 400 includes P type collector 404 at bottom surface 402 of semiconductor substrate 401, and N type drift region 406 situated over P type collector 404. In addition, P type base layer 408 is situated over N type drift region 406. IGBT 400 also includes active cells 420, each of which includes N type emitter diffusions 422, and a gate provided by gate insulator 426 and wide gate electrodes 428 situated in wide deep insulated trenches 413. Each of active cells 420 also includes N type implant zone 440 situated between wide deep insulated trenches 413.

Active cells 420 are situated adjacent dummy cells 430, the substantial entirety of which, according to the implementation of FIG. 4, are formed by wide deep insulated trenches 413. Also shown in FIG. 4 are thick insulation 416, and wide buried depletion electrodes 418 disposed in each of wide deep insulated trenches 413 under respective wide gate electrodes 428.

Semiconductor substrate 401 corresponds to semiconductor substrate 301, in FIG. 3. That is to say, P type collector 404, N type drift region 406, P type base layer 408, and N type implant zones 440, in FIG. 4, correspond respectively to P type collector 304, N type drift region 306, P type base layer 308, and N type implant zones 340, in FIG. 3. Moreover, N type emitter diffusions 422, gate insulator 426, and thick insulation 416, in FIG. 4, correspond respectively to N type emitter diffusions 322, gate insulator 326, and thick insulation 316, in FIG. 3.

IGBT 400, in FIG. 4, differs from IGBT 300, in FIG. 3, in that substantially the entirety of dummy cell 430 is formed as wide deep insulated trenches 413 including wide gate electrodes 418 and wide buried depletion electrodes 418. Like first and second deep insulated trenches 311 and 312, in FIG. 3, wide deep insulated trenches 413, in FIG. 4, extend from surface 403 into N type drift region 406. Moreover, the depth of wide deep insulated trenches 413 may be substantially the same as the depth of first and second deep insulated trenches 311 and 312.

Wide gate electrodes 428 and wide buried depletion electrodes 418 may be formed of the same materials and using the same techniques utilized for formation of respective gate electrodes 328 and buried depletion electrodes 318. That is to say, gate electrodes 428 may be formed of doped polysilicon, while wide buried depletion electrodes 418 may be formed of any suitable conductor, such as doped polysilicon, or metal, for example. According to the implementation of FIG. 4, wide buried depletion electrodes 418 are shorted to N type emitter diffusions 422 of IGBT 400 in the third dimension relative to the cross-sectional plane of FIG. 4 (electrical connections not explicitly shown in the cross-sectional perspective of FIG. 4).

Like IGBT 300, in FIG. 3, IGBT 400 is capable of providing both improved (i.e., longer) $T_{SC}$ and improved (i.e., reduced) $V_{CE(on)}$, concurrently. By implementing first and second deep insulated trenches 411 and 412 as wide trenches, IGBT 400 has a reduced channel density relative to conventional IGBT designs. Consequently, the saturation current of IGBT 400 is reduced, resulting in an advantageous increase in $T_{SC}$. In addition, the presence of implant zone 440 in each of active cells 420 improves conductivity modulation in IGBT 400 by enhancing the carrier profile in N type drift region 406 in the conducting state, thereby advantageously reducing $V_{CE(on)}$. Moreover, buried depletion electrodes 418 can be used to deplete implant zone 440 in the blocking state, when buried depletion electrodes 418 are tied to a low electrical potential, e.g., grounded or at a near ground potential, to support a high breakdown voltage for IGBT 400. Furthermore, because buried depletion electrode 418 can be disposed under gate electrode 428 and between gate electrode 428 and P type emitter 404, buried depletion electrode 418 can also serve to substantially minimize the gate-to-collector capacitance of IGBT 400 despite the width of wide gate electrode 428.

Figure 5:
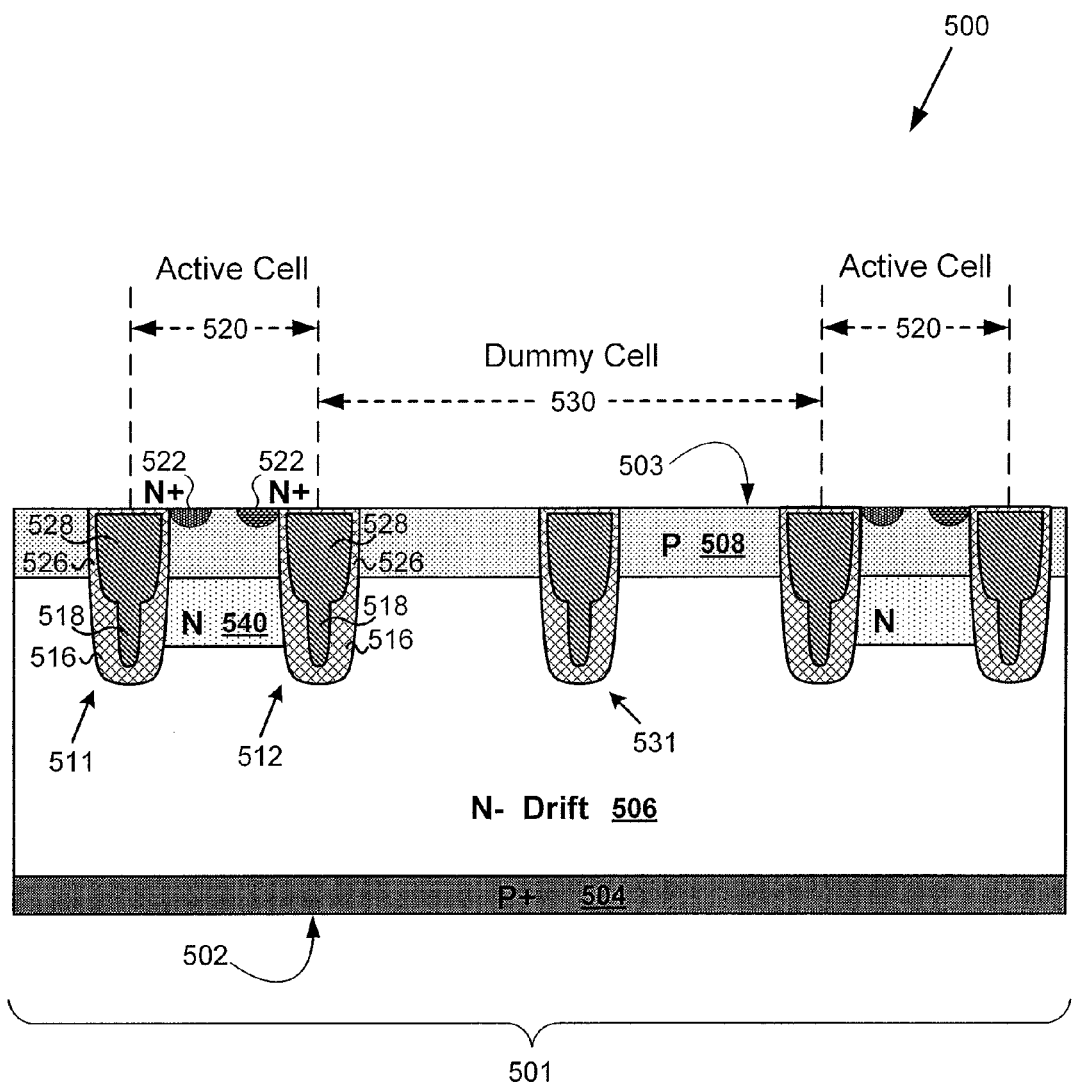
FIG. 5 presents a cross-sectional view of another exemplary deep trench IGBT structure.

FIG. 5 presents a cross-sectional view of an exemplary deep gate trench IGBT structure. IGBT 500 includes P type collector 504 at bottom surface 502 of semiconductor substrate 501, and N type drift region 506 situated over P type collector 504. In addition, P type base layer 508 is situated over N type drift region 506. IGBT 500 also includes active cells 520 and dummy cell 530 neighboring active cells 520. Each of active cells 520 includes N type emitter diffusions 522, and N type implant zone 540 situated between first and second deep insulated gate trenches 511 and 512. Each of first and second deep insulated gate trenches 511 and 512 includes gate insulator 526, gate electrode 528 including buried depletion electrode portion 518, and thick insulation 516 disposed therein. Moreover, according to the implementation shown by FIG. 5, dummy cell 530 includes dummy cell deep insulated gate trench 531 also having gate insulator 526, gate electrode 528, and thick insulation 516 disposed therein.

Semiconductor substrate 501 corresponds to semiconductor substrate 101, in FIGS. 1A, 1B, and 1C. That is to say, P type collector 504, N type drift region 506, and N type implant zones 540, in FIG. 5, correspond respectively to P type collector 104, N type drift region 106, and N type implant zones 140, in FIGS. 1A, 1B, and 1C, and, thus, may share any of the characteristics previously attributed to those corresponding features, above. In addition, N type emitter diffusions 522, gate insulator 526, and thick insulation 516 correspond respectively to N type emitter diffusions 122, gate insulator 126, and thick insulation 116, in FIGS. 1A, 1B, and 1C. Furthermore, P type base layer 508 corresponds to P type base layer 108, in FIG. 1A.

First and second deep insulated gate trenches 511 and 512 of IGBT 500 provide a gate for active cell 520 and each also utilizes buried depletion electrode portion 518 of gate electrode 528 as a buried depletion electrode for active cell 520. In other words, according to the implementation shown by FIG. 5, gate electrode 528 and the buried depletion electrode provided by buried depletion electrode portion 518 are merged. It is noted that the depth of first and second deep insulated gate trenches 511 and 512, and dummy cell deep insulated gate trench 531 may be substantially the same as the depth of first and second deep insulated trenches 111 and 112, and dummy cell deep insulated trench 131, in FIGS. 1A, 1B, and 1C.

Gate electrode 528 may be formed using any material typically utilized in the art. For example, gate electrode 528 may be formed of doped polysilicon. As described above by reference to FIG. 1A, although the electrical connection among gate electrodes 528 of IGBT 500 is not explicitly shown in the cross-sectional perspective provided by FIG. 5, gate electrodes 528 can be shorted together in the third dimension relative to the cross-sectional plane of FIG. 5. Thus, according to the implementation shown in FIG. 5, each of the buried depletion electrodes provided by buried depletion electrode portions 518 of gate electrodes 528 are electrically shorted to the gate of IGBT 500 in the third dimension relative to the cross-sectional plane of FIG. 5 as well.

Like IGBT 100A, IGBT 100B, and IGBT 100C, IGBT 500 provides both improved (i.e., longer) $T_{SC}$ and improved (i.e., reduced) $V_{CE(on)}$, concurrently. By situating dummy cell 530 so as to neighbor active cells 520, IGBT 500 has a reduced channel density relative to typical IGBT designs from which dummy cell 530 is omitted. Consequently, the saturation current of IGBT 500 is reduced, resulting in an advantageously increased $T_{SC}$. In addition, the presence of implant zone 540 in each of active cells 520 improves conductivity modulation in IGBT 500 by enhancing the carrier profile in N type drift region 506 in the conducting state, thereby advantageously reducing $V_{CE(on)}$. Moreover, buried depletion electrode portions 518 of gate electrodes 528 can be used as buried depletion electrodes to deplete implant zone 540 in the blocking state, when gate electrodes 528 are tied to a low electrical potential, e.g., grounded or at a near ground potential, to support a high breakdown voltage for IGBT 500.

With respect to the specific implementation shown in FIG. 5, it is noted that many modifications are possible. For example, although dummy cell 530 is shown to include a single dummy cell deep gate trench 531, that representation is merely exemplary. In other implementations, dummy cell 530 may include more, many more, or fewer than one dummy cell deep gate trench 531. That is to say, dummy cell 530 may include as few as zero, or as many as "n" dummy cell deep gate trenches 531, where "n" is any desired integer value.

It is further noted that although substrate 501 is shown to include P type base layer 508 corresponding to P type base layer 108, in FIG. 1A, and to omit a layer corresponding to N type buffer or field stop layer 105, that representation is merely exemplary. In other implementations, substrate 501 may include a layer corresponding to N type buffer layer 105, and/or may implement a deep P type diffusion region corresponding to deep P type diffusion region 109, in FIG. 1B. Alternatively, in some implementations, N type drift region 506 may extend upward in dummy cell 530 to semiconductor surface 503. In addition, a conductive material corresponding to conductive material 132, in FIG. 1C, may be formed over semiconductor surface 503 in dummy cell 530, and may be insulated from semiconductor surface 503 by an insulator layer corresponding to insulator layer 134 in FIG. 1C.

In addition to the advantages attributed to IGBTs 100A, 100B, 100C, 200, 300, 400, and 500, above, any of the exemplary IGBT implementations shown by FIGS. 1A, 1B, 1C, 2, 3, 4, and 5 may be used to produce a punch-through IGBT, a non-punch-through IGBT, or a field stop IGBT. Consequently, the present inventive concepts may be implemented across a wide variety of IGBT applications.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. An insulated-gate bipolar transistor (IGBT) in a semiconductor substrate, said IGBT comprising:
   a collector at a bottom surface of said semiconductor substrate, a drift region having a first conductivity type situated over said collector, and a base layer having a second conductivity type opposite said first conductivity type situated over said drift region;
   a plurality of deep insulated trenches extending from a semiconductor surface above said base layer to a depth of greater than six micrometers (6.0 µm) to terminate in said drift region;
   each of said deep insulated trenches having buried depletion electrode and at least one gate electrode disposed therein, said buried depletion electrode reaching deeper into said deep insulated trench than said at least one gate electrode;
   an active cell including an emitter adjacent said at least one gate electrode, and an implant zone, situated between adjacent deep insulated trenches;
   said implant zone being formed below said base layer and having said first conductivity type;
   a dummy cell neighboring said active cell, said dummy cell not having an emitter formed therein, and wherein said implant zone does not extend to said dummy cell.

2. The IGBT of claim 1, wherein said buried depletion electrode comprises doped polysilicon.

3. The IGBT of claim 1, wherein said buried depletion electrode is shorted to said emitter of said IGBT.

4. The IGBT of claim 1, wherein said buried depletion electrode is shorted to said at least one gate electrode.

5. The IGBT of claim 1, wherein said dummy cell includes at least one deep insulated trench with a respective buried depletion electrode disposed therein.

6. The IGBT of claim 1, wherein said dummy cell includes a region having said second conductivity type, but having a depth deeper than said base layer.

7. The IGBT of claim 1, wherein said base layer extends to said dummy cell.

8. The IGBT of claim 1, wherein said base layer is not formed in said dummy cell.

9. The IGBT of claim 1, wherein said at least one gate electrode is merged with said buried depletion electrode.

10. The IGBT of claim 1, further comprising a buffer layer of said first conductivity type formed between said drift region and said collector.

11. An insulated-gate bipolar transistor (IGBT) in a semiconductor substrate, said IGBT comprising:
    a collector at a bottom surface of said semiconductor substrate, a drift region having a first conductivity type situated over said collector, and a base layer having a second conductivity type opposite said first conductivity type situated over said drift region;
    a plurality of deep insulated trenches extending from a semiconductor surface above said base layer to a depth of greater than six micrometers (6.0 µm) to terminate in said drift region;
    each of said deep insulated trenches having a buried depletion electrode and at least one gate electrode disposed therein, said buried depletion electrode reaching deeper into said deep insulated trench than said at least one gate electrode;
    an active cell including an emitter adjacent said at least one gate electrode, and an implant zone, situated between adjacent deep insulated trenches;
    said implant zone being formed below said base layer and having said first conductivity type;
    wherein said buried depletion electrode is situated below and electrically insulated from said at least one gate electrode.

12. The IGBT of claim 11, wherein said buried depletion electrode comprises doped polysilicon.

13. The IGBT of claim 11, wherein said buried depletion electrode is shorted to said emitter of said IGBT.

14. The IGBT of claim 11, wherein said buried depletion electrode is shorted to said at least one gate electrode.

15. The IGBT of claim 11, further comprising a dummy cell neighboring said active cell, said dummy cell not having an emitter formed therein, wherein said implant zone does not extend to said dummy cell wherein said dummy cell includes at least one deep insulated trench with a respective buried depletion electrode disposed therein.

16. The IGBT of claim 11, further comprising a dummy cell neighboring said active cell, said dummy cell not having an emitter formed therein, wherein said implant zone does not extend to said dummy cell, wherein said dummy cell includes a region having said second conductivity type, but having a depth deeper than said base layer.

17. The IGBT of claim 11, further comprising a dummy cell neighboring said active cell, said dummy cell not having an emitter formed therein, wherein said implant zone does not extend to said dummy cell, wherein said base layer extends to said dummy cell.

18. The IGBT of claim 11, further comprising a dummy cell neighboring said active cell, said dummy cell not having an emitter formed therein, wherein said implant zone does not extend to said dummy cell, wherein said base layer is not formed in said dummy cell.

19. The IGBT of claim 11, wherein said at least one gate electrode is merged with said buried depletion electrode.

20. The IGBT of claim 11, further comprising a buffer layer of said first conductivity type formed between said drift region and said collector.

\* \* \* \* \*